United States Patent
Chou et al.

(10) Patent No.: US 7,373,941 B2
(45) Date of Patent: May 20, 2008

(54) WET CLEANING CAVITATION SYSTEM AND METHOD TO REMOVE PARTICULATE WAFER CONTAMINATION

(75) Inventors: Chun-Li Chou, Hsinchu (TW); Hun-Jan Tao, Hsinchu (TW); Peng-Fu Hsu, Hsinchu (TW)

(73) Assignee: Taiwan Semiconductor Manufacturing Co. Ltd, Hsin-chu (TW)

( * ) Notice: Subject to any disclaimer, the term of this patent is extended or adjusted under 35 U.S.C. 154(b) by 345 days.

(21) Appl. No.: 10/402,593

(22) Filed: Mar. 28, 2003

(65) Prior Publication Data

US 2004/0187891 A1    Sep. 30, 2004

(51) Int. Cl.
*B08B 3/12* (2006.01)
*B08B 7/04* (2006.01)
*B08B 5/00* (2006.01)

(52) U.S. Cl. .................... 134/184; 134/102.2; 134/902

(58) Field of Classification Search ................ 134/902, 134/184, 1, 1.3, 18, 10, 30, 37, 102.2, 102.1, 134/111, 186, 191
See application file for complete search history.

(56) References Cited

U.S. PATENT DOCUMENTS 5,365,960 A * 11/1994 Bran .......................... 134/184
6,048,405 A * 4/2000 Skrovan et al. ............... 134/1
6,240,938 B1 * 6/2001 Oshinowo .................. 134/147
6,488,037 B1 * 12/2002 Guldi ......................... 134/1.3

FOREIGN PATENT DOCUMENTS

JP          05013397 A  *  1/1993

OTHER PUBLICATIONS

Kern, Handbook of Semiconductor Wafer Cleaning Technologu, 1993, Noyes Publication, pp. 48-52 and 141-142.*
English translation of JP 05-13397.*

* cited by examiner

Primary Examiner—Alexander Markoff

(57) ABSTRACT

A cavitation cleaning system and method for using the same to remove particulate contamination from a substrate including providing at least one substrate immersed in a cleaning solution said cleaning solution contained in a cleaning solution container. The container further includes means for producing gaseous cavitation bubbles of ultrasound energy, said gaseous cavitation bubbles arranged to contact at least a portion of the at least one substrate; applying ultrasound energy to create gaseous cavitation bubbles to contact the substrate to remove adhering residual particles in a substrate surface cleaning process; and, recirculating the cleaning solution through a particulate filtering means.

17 Claims, 3 Drawing Sheets

WET CLEANING CAVITATION SYSTEM AND METHOD TO REMOVE PARTICULATE WAFER CONTAMINATION

FIELD OF THE INVENTION

This invention generally relates to semiconductor wafer manufacturing and more particularly to methods for cleaning semiconductor wafers to remove particulate contamination.

BACKGROUND OF THE INVENTION

In creating a multiple layer (level) semiconductor device on a semiconductor wafer, each layer making up the device may be subjected to one or more deposition processes, for example using chemical vapor deposition (CVD) or physical vapor deposition (PVD), and usually including one or more dry etching processes. A critical condition in semiconductor manufacturing is the absence of particulate on the wafer processing surface, since microscopic particles may interfere with and adversely affect subsequent processing steps leading to device degradation and ultimately semiconductor wafer rejection.

While the wafer cleaning process has been always been a critical step in the semiconductor wafer manufacturing process, ultraclean wafers are becoming even more critical to device integrity. For example, as semiconductor feature sizes decrease, the detrimental affect of particulate contamination increases, requiring removal of ever smaller particles. For example, particles as small as 5 nm may be unacceptable in many semiconductor manufacturing processes. Further, as the number of device layers increase, for example to 5 to 8 layers, there is a corresponding increase in the number of cleaning steps and the potential for device degradation caused by particulate contamination. To adequately meet requirements for ultraclean wafers in ULSI and VLSI the wafer surface must be essentially free of contaminating particles.

Another factor in modern processing technology that increases the incidence of particle contamination is the deposition of carbon doped oxides as IMD layers to achieve dielectric constants of less than 3.0. The IMD layers are typically deposited by a plasma enhanced CVD (PECVD), low pressure CVD (LPCVD), or high density plasma CVD (HDP-CVD). In these processes, a degree of sputtering occurs as the layer of material is deposited, causing a higher degree of particulate contamination as the deposition time increases. In addition, PVD processes are typically used to deposit films of metal, for example barrier/adhesion layers within anisotropically etched features, or for metal filling an anisotropically etched feature. PVD processes tend to coat the inner surfaces of the processing chamber with a metal film, flaking off to contaminate a wafer process surface as the metal film increases in thickness and is subjected to cyclic thermal stresses. Other processes that frequently result in particulate contamination include plasma etching processes where a photoresist layer is etched away during an ashing process. Over time, the buildup of ashing residue within a plasma etching chamber increases the probability that a semiconductor wafer will become contaminated by particulates.

Particulate contamination may cause 'killer defects' resulting in integrated circuit opens or shorts by occluding a portion of a circuit or providing a shorting path between two conductive lines of a circuit.

Common processes in use for cleaning wafers include cleaning solutions based on hydrogen peroxide. At high pH values (basic) organic contamination and oxidizable particles, are removed by an oxidation process. At low pH (acidic) metal contamination is desorbed from the wafer surface by forming a soluble complex.

Typically, to reduce processing times and increase throughput, in prior at processes, ex-situ cleaning processes are performed following particle generating processes such as plasma etching or PECVD film deposition. For example, common particle removal mechanisms which may be exploited, depending on the particle and how it adheres to the surface, include dissolution, oxidizing degradation and dissolution, physical removal by etching, and electrical repulsion between a particle and the wafer surface.

Standard wafer cleaning processes have included mechanical scrubbing and ultrasonic methods, for example megasonic agitation of the wafer surface in a cleaning solution or in deionized water to effectuate particulate removal. A shortcoming of mechanical scrubbers includes a demonstrated difficulty in removing particles smaller than about 300 nm. In addition, mechanical scrubbers may produce an unacceptable level of scratching in soft materials. In using a megasonic source of agitation, megasonic transducers operating in a frequency range near about 1 MHz are typically attached to the side or bottom portion of a cleaning tank filled with cleaning solution with the surfaces of the process wafers arranged parallel to the direction of traveling or standing megasonic waves induced at the side of the cleaning tank. The transducer is typically rectangular shaped and integrally attached to the cleaning tank to achieve megasonic cleaning action. A shortcoming of prior art megasonic cleaning processes is the relatively low level of cavitation action produced by megasonic transducer arrangements of the prior art. Under certain conditions the ultrasonic energy also creates cavitation bubbles within the liquid and subsequently collapse where the sound pressure exceeds the liquid vapor pressure. When the cavitation bubbles collapse, energy is released causing turbulent flow which can dislodge particles adhering to the wafer surface. Typical stegasonic transducers of the prior art have not sufficiently coupled ultrasonic energy into the cleaning solution to create a sufficiently high density of cavitation bubbles to achieve primarily cavitation collapse induced particulate cleaning. As a result, prior art processes have not been fully successful in removing smaller particles from wafer process surfaces, particularly those smaller than about 0.3 microns.

Another shortcoming of prior art cleaning processes, for example megasonic cleaning processes, is the tendency for the removed particles to reattach to the wafer surface. For example, following treatment of a large number of wafers in megasonic cleaners of the prior art, the cleaning solution must frequently be replaced to avoid particulate recontamination of process wafers.

There is therefore a need in the semiconductor wafer processing art to develop an ultrasonic cleaning system and method driven primarily by cavitation whereby particulate contamination is effectively removed from a process wafer surface while avoiding particulate recontamination.

It is therefore an object of the invention to provide an ultrasonic cleaning system and method driven primarily by cavitation whereby particulate contamination is effectively removed from a process wafer surface while avoiding particulate recontamination, in addition to overcoming other shortcomings and deficiencies of the prior art.

SUMMARY OF THE INVENTION

To achieve the foregoing and other objects, and in accordance with the purposes of the present invention, as embodied and broadly described herein, the present invention provides a cavitation cleaning system and method for using the same to remove particulate contamination from a substrate.

In a first embodiment the method for using the cavitation cleaning system includes providing at least one substrate immersed in a cleaning solution said cleaning solution contained in a cleaning solution container said cleaning solution container further including means for producing gaseous cavitation bubbles by application of ultrasound energy said gaseous cavitation bubbles arranged to contact at least a portion of the at least one substrate; applying ultrasound energy to create gaseous cavitation bubbles to contact the at least one substrate to remove adhering residual particles in a substrate surface cleaning process; and, recirculating the cleaning solution through a particulate removing filtering means during the substrate surface cleaning process.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Figure 1A:
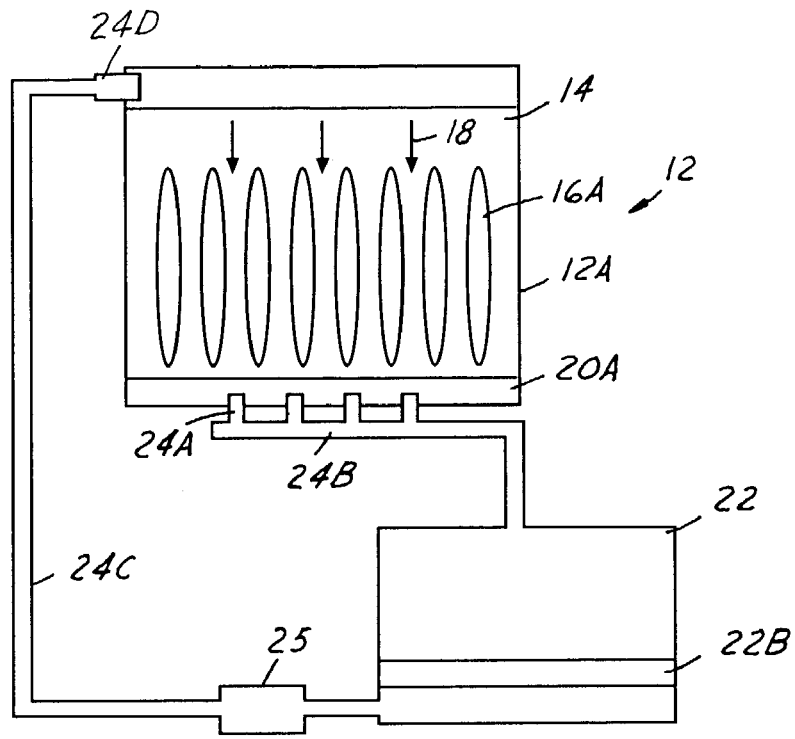
FIGS. 1A-1B are representative cross sectional side views of portions of exemplary cavitation cleaning systems including several embodiments of the present invention.
Figure 2A:
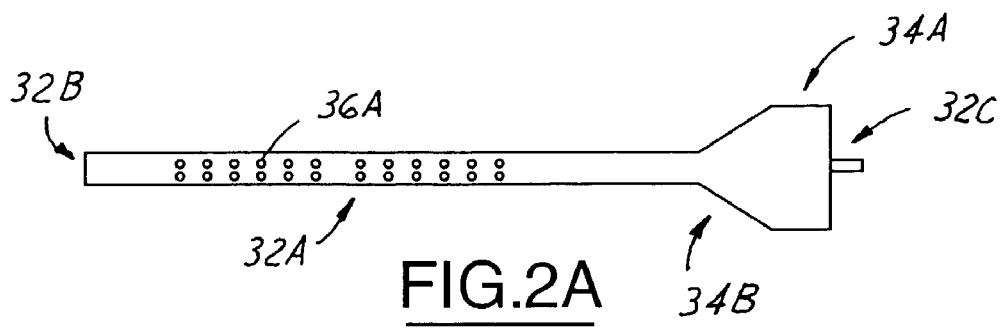
FIGS. 2A and 2B are schematic representations of a portion of an exemplary cavitation cleaning system for use in the cavitation cleaning process according to an embodiment of the present invention.

Referring to FIG. 1A, in an exemplary first embodiment, an ultrasonic cavitation system is provided for producing cavitation bubbles for assisting in removal of particulate contamination adhering to semiconductor process wafers. A cavitation cleaning module 12 enclosed by a housing e.g., 12A is provided having a cavitation power system (not shown), including at least one vibration generator 14 powered by transducers, for example disposed in an upper portion of the cleaning module 12. The vibration generator 14, includes cavitation bubble producers (e.g., cavitation rods as shown in FIG. 2A) mounted in vibrational producing relationship with the vibration generator 14 for coupling ultrasonic energy into the cavitation bubble producers to produce cavitation bubbles. Preferably, the cavitation bubbles produced by the cavitation bubble producers are formed to flow in a direction parallel to a wafer process surface to contact the wafer process surfaces within the cleaning module 12.

For example, the cleaning module 12 is preferably configured to accept a cassette holding a plurality of wafers e.g., 16A the wafer surfaces are preferably arranged below the cavitation bubble producers to contact the cavitation bubbles flowing according to gravitational influence and/or induced fluid flow toward and parallel to the wafer surfaces as indicated conceptually by directional arrows, e.g., 18. Disposed in a lower portion of the cleaning module 12, is a particulate filtering means 20A, arranged below the wafers. The particulate filtering means for example, preferably includes of a series of flow passageways as is known the art including repeatedly changing flow path directions such that upon a change of flow direction, a particle in solution is captured along the flow passageway wall the wall including ribbing or raised areas for capturing and retaining the particles. While many suitable particulate filters are commercially available it is important that the pressure drop across the filter be minimized to allow a continuous flow of cleaning solution to be provided to the cleaning module 12 to fill the cleaning module to a level to at least cover cavitation bubble producers attached to the at least one vibration generator 14 disposed in an upper portion of the cleaning module 12. Preferably, the cleaning solution is recirculated from a cleaning solution reservoir 22 following filtering of the cleaning solution to remove particulates from the cleaning solution.

For example, multiple cleaning solution outlets e.g., 24A may be provided in the lower portion of the cleaning module 12 to provide cleaning solution recirculation outlet pathways after at least partially passing through particulate filtering means 20. For example a plurality of cleaning solution outlets e.g., 24A, communicate with a common fluidic flow pathway e.g., 24B to capture the cleaning solution and return it to the cleaning solution reservoir 22. The cleaning solution is in turn provided to the cleaning module 12 from cleaning solution reservoir 22, for example by fluidic pumping means 25 for pumping cleaning solution along fluidic flow pathway 24C to a recirculation inlet e.g., 24D provided in an upper portion of the cleaning module 12, for example, preferably above a process wafer level, to maintain a cleaning fluid level to cover the cavitation bubble producers. optionally, the cleaning solution reservoir includes a heat exchange unit e.g., 22B for heating or cooling the recirculating cleaning solution to maintain a cleaning solution temperature. Optionally, another particulate filtering means (not shown) may be included in the cleaning solution reservoir 22 for removing particles in the cleaning solution similar to particle filtering means 20A. In addition, preferably, a controller (not shown) is in communication with temperature sensor units disposed in both the cleaning module 12 and the cleaning solution reservoir 22 as well as in responsive communication with the heat exchange unit 2B and fluidic pumping means 25 for automated control of a cleaning solution temperature and recirculation flow rate to maintain a predetermined cleaning solution level at a predetermined temperature in cleaning module 12.

Figure 1B:
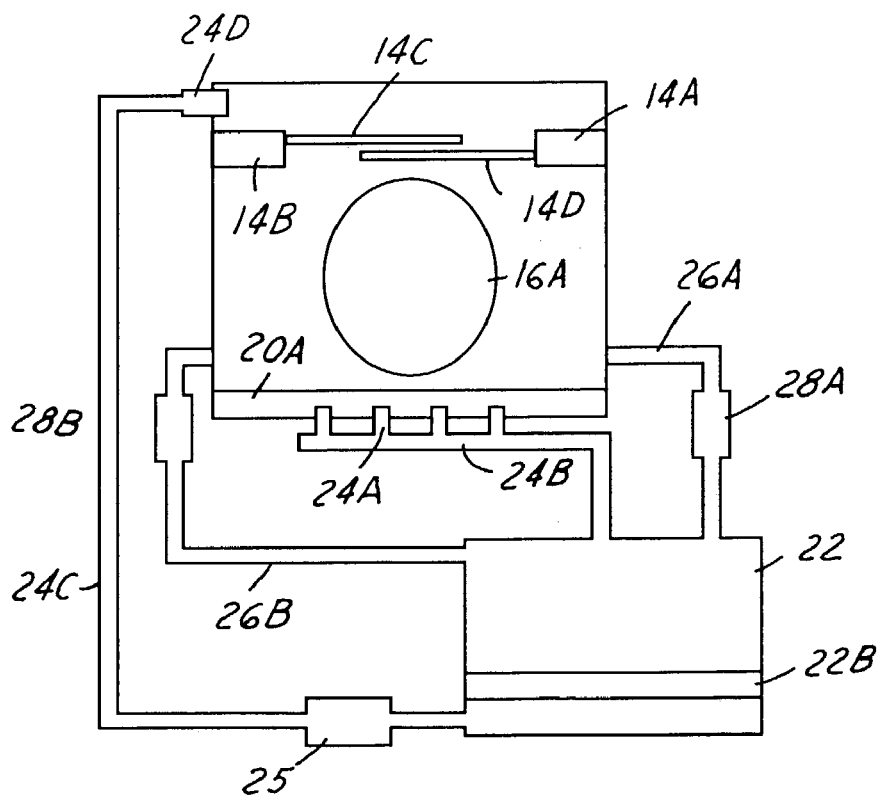

Referring to FIG. 1B is shown another embodiment showing an alternative side view of the cleaning module 12 and solution reservoir 22 with the wafer e.g., 16A having a major surface arranged perpendicular to the view direction. Two vibration generators 14A and 14B are shown in an upper portion of the cleaning module 12 including respectively attached cavitation bubble producers 14D and 14C disposed over wafer e.g., 16A. In an exemplary embodiment, one or more cleaning solution flow pathways e.g., 26A, 26B, are provided in a sidewall of the cleaning module 12, preferably above the particle filtering means 20 to provide for unobstructed flow. Fluid pumping means e.g., 28A and 28B, for example conventional fluidic pumps, are provided in respective cleaning solution flow pathways e.g., 26A, and 26B to provide for accelerated drainage of the cleaning solution from cleaning module 12 following termination of cavitation. For example, it has been found that is frequently advantageous to quickly drain the cleaning fluid from the cleaning module following a cavitation cleaning process to prevent reattachment of particles remaining in the cleaning solution to the process wafer surface following termination of cavitation. For example, in operation, following a cavitation cleaning process, cavitation power supply is terminated to the at least one vibration generator 14, followed by accelerated removal of the cleaning solution from cleaning module 12 by aid of pumping means e.g., 28A and 28B, and respective solution flow pathways e.g., 26A, and 26B, to cleaning solution reservoir 22, for example at flow rates of about 1 to about 10 gallons per minute. For example, preferably, the cleaning solution is removed before it can diffuse or migrate a distance from about a center portion between wafer surfaces to a wafer surface. Particles remaining in the cleaning solution may be removed from the cleaning solution in a subsequent particulate filtering process, for example, by passing the cleaning solution through particulate filtering means included in the cleaning module 12 and/or the cleaning solution reservoir 22.

Referring to FIG. 2A is shown a cross sectional side view of an exemplary cavitation bubble producer 30, for example a cavitation rod preferably formed of quartz having a hollowed cylindrical portion forming a longitudinally extending length portion e.g., 32A, preferably closed at a distal end 32B, and a cylindrical base portion e.g., 34A opposite the distal end 32B, attached to the longitudinally extending length portion 32A, for example, by means of a tapered transition portion 34B tapered down from a larger radius of the base portion 34A to the smaller radius of the axially extending length portion 32A. Optionally attached to base portion 34A is an inlet 32C for supplying a flow of gas, for example, preferably compressed air or nitrogen to pass along the axially extending length portion 32 at a predetermined flow rate and pressure for producing cavitation bubbles. Formed over at least a portion of the axially extending length portion 32A are apertures, e.g., 36A, formed to penetrate the wall of the hollowed cylinder forming the longitudinally extending length portion 32A to communicate with a gas flow within the longitudinally extending length portion 32A. Preferably, the apertures penetrating the axially extending length portion 32A are formed at a predetermined radial spacing and predetermined axial (longitudinal) spacing along at least a portion of the longitudinally extending length portion 32A. For example, in an exemplary embodiment, the apertures, e.g., 36A, are from about 0.2 microns to about 0.5 microns in diameter. For example, the apertures, e.g., 36A, include a plurality of apertures having a spacing between adjacently disposed apertures of from about 2 aperture diameters to about 10 aperture diameters measured from an aperture opening edge.

Figure 2B:
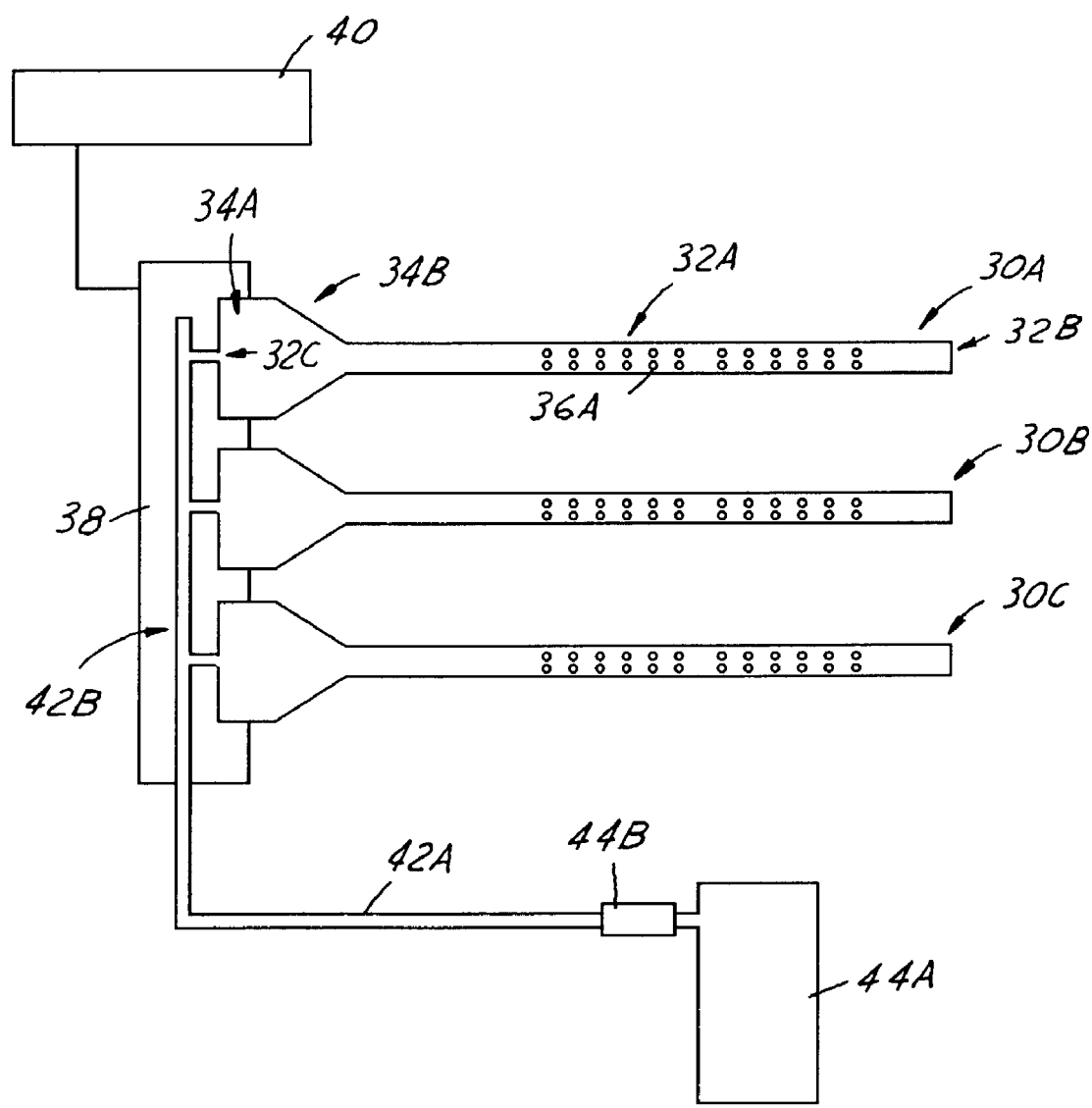

Referring in FIG. 2B in operation, a plurality of cavitation bubble producers (rods) e.g., 30A, 30B, 30C are mounted with the base portion e.g., 34A in vibrational relationship with vibration generator 38 which is arranged having embedded transducers (not shown) connected to power source 40 as is known in the art to cause the vibration generator 38, and thus the attached cavitation rods e.g., 30A, 30B, 30C, to vibrate at a predetermined frequency. For example, it will be appreciated that the cavitation rods have a predetermined characteristic vibrational resonant frequency that is dependent on both their dimensions and material, i.e., quartz. It is frequently preferable to operate at or near the characteristic resonant frequency of the cavitation rods to maximize a cavitation bubble density. For example the resonant frequency of the individual rods may vary slightly among one another, making the most effective operating frequency of the vibration generator an average of the various resonant frequencies. While the dimensions of the cavitation rods may be varied to vary an operating resonant frequency, it has been found that operating resonant frequencies of between about 400 kHz and about 2 MHZ are suitably used where a sufficient density of cavitation bubbles are be produced to effectively remove particles including smaller particles, for example, having a diameter smaller than about 0.3 microns without damaging to the process wafer.

Still referring to FIG. 2B, in operation, the vibration generator 38 is supplied with a gas flow, for example along gas flow pathway 42A in communication with gas source 44A. A flow controller, for example a mass flow controller 44B is disposed between the gas source 44A and vibration generator 38. A gas supply manifold 42B is disposed in vibration generator 38 for individually supplying gas flow to the individual cavitation rods, e.g., 30A, 30B, 30C. For example, in operation the vibration generator 38 is supplied with a resonant frequency cavitation power from power source 40 for producing a vibrational frequency at or near the resonant frequency of the cavitation rods submerged in cleaning solution to produce cavitation bubbles in the cleaning solution. At about the same time a predetermined gas flow of preferably nitrogen or compressed air is supplied from gas source 44A to the cavitation rods, at a predetermined gas flow rate, for example at flow rate of about 1 sccm to about 1000 sccm. The cavitation (operating) power is then adjusted to a predetermined operating power level for achieving resonant frequency and producing a predetermined density of cavitation bubbles and/or interactively adjusted to achieve a desired cavitation bubble density.

In operation, the cavitation rods are arranged to be submerged in a cleaning solution and to extend perpendicular to and above a wafer process surface. When cavitation bubbles are created to exit through the apertures in the cavitation rods into the cleaning solution, the cavitation bubbles are drawn downward by at least one of gravity and induced fluidic flow to contact the process wafer surfaces. The cavitation bubbles preferably contact the process wafer surfaces including at least partially surrounding and encompass contaminating particles thereby removing the contaminating particles into the cleaning solution where they are preferably subsequently removed by particle filtering means.

The cleaning solution may be any cleaning solution including deionized water or other solutions frequently used for cleaning. For example exemplary cleaning solutions may include at least one of a solution of hydrogen peroxide ($H_2O_2$) and sulfuric acid ($H_2SO_4$), a solution of hydrogen peroxide with choline (($CH_3)_3$ $N(CH_2CH_2OH)OH$), a solution of $H_2O_2$ and $NH_4OH$ and a solution of $H_2O_2$ and $HCl$, and a solution of a carboxylic group containing acid, such as citric acid, and deionized water.

Figure 3:
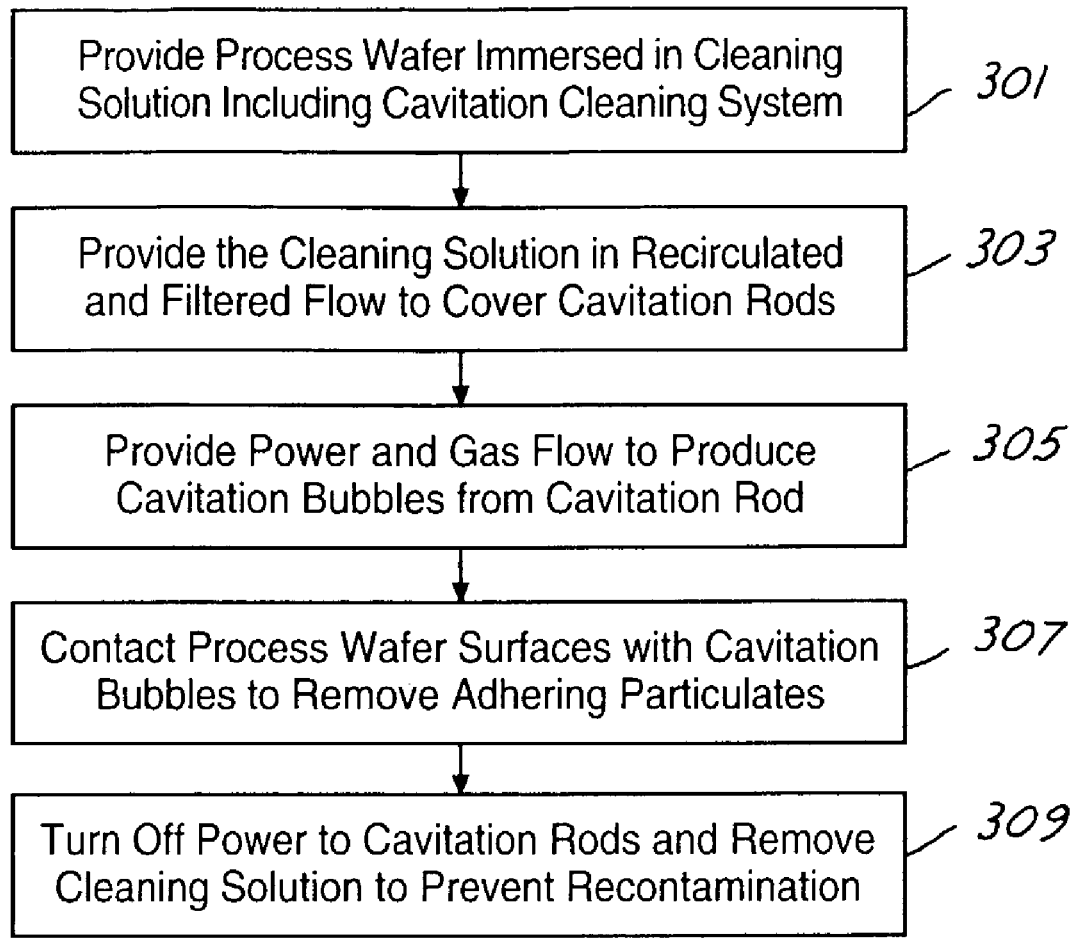
FIG. 3 is a process flow diagram including the cavitation cleaning process using the cavitation cleaning system according to embodiments of the present invention.

Referring to FIG. 3 is a process flow diagram including a cavitation bubble cleaning method using the cavitation bubble cleaning system according to several embodiments of the present invention. In process 301, a process wafer, for example a cassette of process wafers, is immersed in a cleaning solution contained in a cleaning module having a cavitation cleaning system including cavitation rods for forming cavitation bubbles to contact the process wafer surfaces. In process 303, the cleaning solution is supplied in recirculating relationship to the cleaning module to cover the process wafers including the cavitation rods. In process 305, a gas flow is supplied to the cavitation rods and a cavitation power is supplied to the vibration generator to vibrate the cavitation rods at a predetermined frequency to form a plurality of cavitation bubbles within the cleaning solution. In process 307, the cavitation bubbles contact the process wafer surfaces for a period of time to substantially remove particulate contamination. In process 309, the cavitation power is turned off and the remaining cleaning solution within the cleaning module is pumped out at an accelerated flow rate to avoid particle recontamination of the wafer surfaces.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A cavitation cleaning system comprising:
   at least one longitudinally extending hollow member including orifices, said longitudinally extending hollow member comprising quartz, said orifices extending through a sidewall of the at least one longitudinally extending hollow member, said at least one longitudinally extending hollow member disposed in contact with a ultrasonic energy generator at an end portion of said hollow member, said ultrasonic energy for vibrating said hollow member, said hollow member disposed in a cleaning solution container, said cleaning solution container including cleaning solution covering said hollow member, said hollow member coupling said ultrasonic energy into said cleaning solution to produce gaseous cavitation bubbles within said cleaning fluid, wherein said cavitation system further comprises a gas source and gas supply means to supply the longitudinally extending hollow member with a flow of gas.

2. The cavitation cleaning system of claim 1, wherein the at least one longitudinally extending hollow member is arranged to overlie the at least one substrate provided in said cleaning chamber such that the gaseous cavitation bubbles contact at least a portion of the substrate including at least one major surface.

3. The cavitation cleaning system of claim 1, wherein the at least one longitudinally extending hollow member is vibrated near a characteristic resonant frequency of between about 400 kHz to about 2 MHZ to produce the gaseous cavitation bubbles.

4. The cavitation cleaning system of claim 1, further comprising a cleaning solution reservoir disposed in recirculating relationship with the cleaning solution container the recirculating relationship comprising at least one recirculation pathway for recirculating the cleaning solution.

5. The cavitation cleaning system of claim 4, further comprising a particulate filter provided in the at least one recirculation pathway to remove residual particles from the cleaning solution prior to recirculation.

6. The cavitation cleaning system of claim 4, further comprising a recirculating inlet in the at least one recirculation pathway, said recirculating inlet disposed in an upper portion of the cleaning solution container to maintain a cleaning solution level above the at least one longitudinally extending hollow member.

7. The cavitation cleaning system of claim 4, further comprising a controller communicating with at least one temperature sensor and heat exchanger for controlling a cleaning solution temperature, the controller further communicating with at least one flow rate sensor and flow rate controller for automated control of the recirculating cleaning solution temperature and flow rate.

8. The cavitation cleaning system of claim 1, further comprising at least one cleaning solution outlet communicating with at least one pump, said cleaning solution outlet disposed in a lower portion of the cleaning solution container.

9. The cavitation cleaning system of claim 1, wherein the cleaning solution container accommodates a plurality of semiconductor process wafers.

10. The cavitation cleaning system of claim 1, wherein said orifices are from about 0.2 microns to about 0.5 microns in diameter.

11. A cavitation cleaning system comprising:
    at least one longitudinally extending hollow member including orifices extending through a sidewall of the at least one longitudinally extending hollow member, said at least one longitudinally extending hollow member disposed in contact with a ultrasonic energy generator at an end portion of said hollow member, said ultrasonic energy for vibrating said hollow member, said hollow member disposed in a cleaning solution container, said cleaning solution container including cleaning solution covering said hollow member, said hollow member coupling said ultrasonic energy into said cleaning solution to produce gaseous cavitation bubbles within said cleaning fluid, wherein said cavitation system further comprises a gas source and gas supply means to supply the longitudinally extending hollow member with a flow of gas.

12. The cavitation cleaning system of claim 11, wherein the at least one longitudinally extending hollow member is arranged to overlie the at least one substrate provided in said cleaning chamber such that the gaseous cavitation bubbles contact at least a portion of the substrate including at least one major surface.

13. The cavitation cleaning system of claim 11, wherein the at least one longitudinally extending hollow member comprises quartz.

14. The cavitation cleaning system of claim 11, wherein the at least one longitudinally extending hollow member is vibrated near a characteristic resonant frequency of between about 400 kHz to about 2 MHZ to produce the gaseous cavitation bubbles.

15. The cavitation cleaning system of claim 11, further comprising a cleaning solution reservoir disposed in recirculating relationship with the cleaning solution container the recirculating relationship comprising at least one recirculation pathway for recirculating the cleaning solution.

16. The cavitation cleaning system of claim 15, further comprising a controller communicating with at least one temperature sensor and heat exchanger for controlling a cleaning solution temperature, the controller further communicating with at least one flow rate sensor and flow rate controller for automated control of the recirculating cleaning solution temperature and flow rate.

17. The cavitation cleaning system of claim 11, wherein said orifices are from about 0.2 microns to about 0.5 microns in diameter.

* * * * *